(12) United States Patent
Pouilly et al.

(10) Patent No.: US 11,142,148 B2
(45) Date of Patent: Oct. 12, 2021

(54) ELECTRICAL CONNECTION BAR, NOTABLY FOR A VEHICLE INVERTER

(71) Applicant: Valeo Siemens eAutomotive France SAS, Cergy (FR)

(72) Inventors: Aurélien Pouilly, Poissy (FR); Bruno Condamin, Pontoise (FR); Alexandre Legendre, Jouy-le-Moutier (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 0 days.

(21) Appl. No.: 16/526,758

(22) Filed: Jul. 30, 2019

(65) Prior Publication Data
US 2020/0039455 A1 Feb. 6, 2020

(30) Foreign Application Priority Data

Jul. 31, 2018 (FR) ...................................... 1857185

(51) Int. Cl.
*B60R 16/023* (2006.01)
*B60L 50/51* (2019.01)
*B60R 16/03* (2006.01)

(52) U.S. Cl.
CPC .......... *B60R 16/0239* (2013.01); *B60L 50/51* (2019.02); *B60R 16/0231* (2013.01); *B60R 16/03* (2013.01); *B60L 2210/40* (2013.01)

(58) Field of Classification Search
CPC . B60R 16/0239; B60R 16/03; B60R 16/0231; B60L 50/51; B60L 2210/40; Y02T 10/70; H05K 7/1432; H01R 13/02; H01R 13/502; H01R 13/639; H01R 2201/26
See application file for complete search history.

(56) References Cited

U.S. PATENT DOCUMENTS

2005/0032404 A1* 2/2005 Furuta ..................... B60L 1/003
439/157
2005/0211490 A1* 9/2005 Shimizu .................. B60L 50/15
180/243
(Continued)

FOREIGN PATENT DOCUMENTS

| DE | 102016215286 A1 | 2/2018 |
| EP | 2534735 A1 | 12/2012 |
| EP | 3136571 A1 | 3/2017 |

OTHER PUBLICATIONS

French Search Report in FR 1857185.

*Primary Examiner* — Hal Kaplan
*Assistant Examiner* — Thai H Tran
(74) *Attorney, Agent, or Firm* — JCIP; Joseph G. Chu; Jeremy I. Maynard

(57) ABSTRACT

The invention pertains to an electrical connection bar configured to electrically connect a first electrical equipment and a second electrical equipment, notably in a vehicle, the electrical connection bar comprising an electrical connection module configured so as to supply the first electrical equipment with an electrical energy controlled by the second electrical equipment. The electrical connection bar further comprises a transmission module configured to transmit into the second electrical equipment an electrical signal representative of a physical property of the first electrical equipment, the transmission module being integrated with the electrical connection module.

17 Claims, 2 Drawing Sheets

(56) References Cited

U.S. PATENT DOCUMENTS

| | | | |
|---|---|---|---|
| 2007/0144822 A1* | 6/2007 | Tominaga | B62D 5/0406 180/444 |
| 2007/0216327 A1* | 9/2007 | Sugita | B60L 50/16 318/269 |
| 2008/0116838 A1* | 5/2008 | Hattori | F04B 39/121 318/722 |
| 2010/0127586 A1* | 5/2010 | Yoshida | B60W 10/08 310/71 |
| 2011/0070475 A1 | 3/2011 | Thomas | |
| 2015/0333602 A1* | 11/2015 | Mohr | H02K 9/19 310/54 |
| 2018/0262089 A1* | 9/2018 | Hatch | H02K 9/19 |

\* cited by examiner

ELECTRICAL CONNECTION BAR, NOTABLY FOR A VEHICLE INVERTER

CROSS-REFERENCE TO RELATED APPLICATION

This application is a national application claiming priority benefit to France Patent Application FR 1857185, filed on Jul. 31, 2018. The entire contents and disclosures of the above application are incorporated herein by reference.

TECHNICAL FIELD AND SUBJECT OF THE INVENTION

The invention relates, generally speaking, to electrical connection bars, notably installed in automobile vehicles.

The invention more specifically pertains to an electrical connection bar coupled between a first electrical equipment and a second electrical equipment, notably between an electric motor and an inverter, for example configured to be on board a vehicle.

STATE OF THE ART

In an electric vehicle (EV) or a hybrid electric vehicle (HEV), an inverter is configured to convert a high voltage direct current into an alternating current. The electric motor of the vehicle is thus supplied with the alternating current generated by the inverter.

Several solutions exist concerning the connection between the inverter and the electric motor. For example, electrical motorisation systems exist in which the inverter is coupled to the electric motor using an electrical connection module installed on an electrical connection bar. To make the connection between the inverter and other items of equipment such as a resolver and a locking module (Interlock System), one or more connection modules are respectively installed on one or more electrical connection bars distinct from the electrical connection bar described above, which makes it possible to connect the inverter to the phases of the electric motor. This configuration of connections cannot be easily adapted to a more modularised configuration of the items of equipment of the vehicle, which leads to a considerable bulk in order to house these items of equipment, as well as a plurality of connection bars. Nevertheless, notably in an EV or HEV of modest size, the space in an engine compartment is often limited.

The invention thus aims to resolve the aforesaid drawbacks by proposing an electrical connection bar, in order to improve the configuration of the items of equipment installed in the engine compartment and to reduce the space needed to house these items of equipment in the engine compartment of the vehicle.

SUMMARY OF THE INVENTION

To achieve this result, the present invention relates to an electrical connection bar configured to electrically connect a first electrical equipment and a second electrical equipment, notably in a vehicle. The electrical connection bar comprises an electrical connection module configured so as to supply the first electrical equipment with an electrical energy controlled by the second electrical equipment. The electrical connection bar further comprises a transmission module configured to transmit into the second electrical equipment an electrical signal representative of a physical property of the first electrical equipment, the transmission module being integrated with the electrical connection module.

The invention thereby makes it possible to reduce the number of electrical connection bars, to improve the modularisation of these items of equipment and also to reduce the space needed to house the items of equipment in the engine compartment of the vehicle.

In a preferential manner, the electrical connection bar comprises a locking module configured to be coupled to a closing/opening element of the first electrical equipment and configured to deactivate the second electrical equipment when the closing/opening element is actuated in such a way as to open the first electrical equipment, said locking module being integrated with the electrical connection module.

Advantageously, the transmission module comprises a connector configured to engage with a corresponding connector of the first electrical equipment.

Preferentially, the connector of the transmission module is fixed on the electrical connection bar so as to be translationally moveable.

In an advantageous manner, the electrical connection bar comprises a body made of electrically insulating material, the electrical connection module comprising at least one electrical conductor configured to supply the first electrical equipment with a current generated by the second electrical equipment, the transmission module comprising at least one electrical conductor configured to transmit into the second electrical equipment said electrical signal representative of a physical property of the first electrical equipment, said body maintaining together said electrical conductors of the electrical connection module and the transmission module.

Preferentially, the locking module comprises at least one electrical conductor configured to be connected to an electrical circuit of the second electrical equipment, said body maintaining together said at least one electrical conductor of the locking module with the electrical conductors of the electrical connection module and the transmission module.

In a preferential manner, the body comprises a first portion, designated interface portion, configured to cooperate with an interface between the first electrical equipment and the second electrical equipment, and in which:
  a first part of the electrical connection bar extends from a first side of the interface portion of the body, so as to be housed at least in part in the first equipment, and
  a second part of the electrical connection bar extends from a second side of the interface portion of the body, so as to be housed at least in part in the second electrical equipment.

Advantageously, the body comprises a second portion extending transversally from the interface portion and comprised in the second part of the electrical connection bar, said second portion forming a support for the connector of the transmission module.

Preferentially, the second portion of the body forms a support for a detector of the locking module, said detector being configured to detect when said closing/opening element is actuated in such a way as to open the first electrical equipment.

The invention also relates to an electrical system, notably configured to be on board a vehicle, comprising a first electrical equipment, a second electrical equipment and an electrical connection bar such as briefly described above, said electrical connection bar being mounted at an interface between the first electrical equipment and the second electrical equipment.

In a preferential manner, the first electrical equipment and the second electrical equipment are respectively installed in a corresponding box, the box in which the first electrical equipment is installed comprising a closing/opening element configured for the closing/opening of the box.

Advantageously, the closing/opening element forms an actuator configured to actuate a module for locking the electrical connection bar when the closing/opening element closes or opens the box of the first electrical equipment.

Preferentially, the closing/opening element forms a cover of the box and comprises an excrescence, notably a rod, said excrescence being formed on an inner surface of the cover and configured to:
  press on a detector of the locking module when the cover is closed so as to enable an operation of the second electrical equipment; and
  release said detector when the cover is open so as to deactivate the second electrical equipment.

In an advantageous manner, the electrical system comprises the electrical connection bar such as briefly described above, in which the closing/opening element forms an actuator configured, when the closing/opening element closes the box of the first electrical equipment, to press on the connector of the transmission module of the electrical connection bar so as to displace it towards a corresponding connector of the first electrical equipment.

Preferentially, the first electrical equipment forms an electric motor and the second electrical equipment forms an inverter controlling said electric motor.

BRIEF DESCRIPTION OF THE FIGURES

Other characteristics and advantages of the invention will become clear from reading the detailed description of embodiments of the invention, given only as examples, and by referring to the drawings which show.

DETAILED DESCRIPTION OF THE INVENTION

Hereafter, the embodiments described more particularly focus on an exemplary embodiment of an electrical connection bar according to the invention. However, any embodiment in a different context, in particular in any type of vehicle, is also targeted by the present invention.

Figure 1:
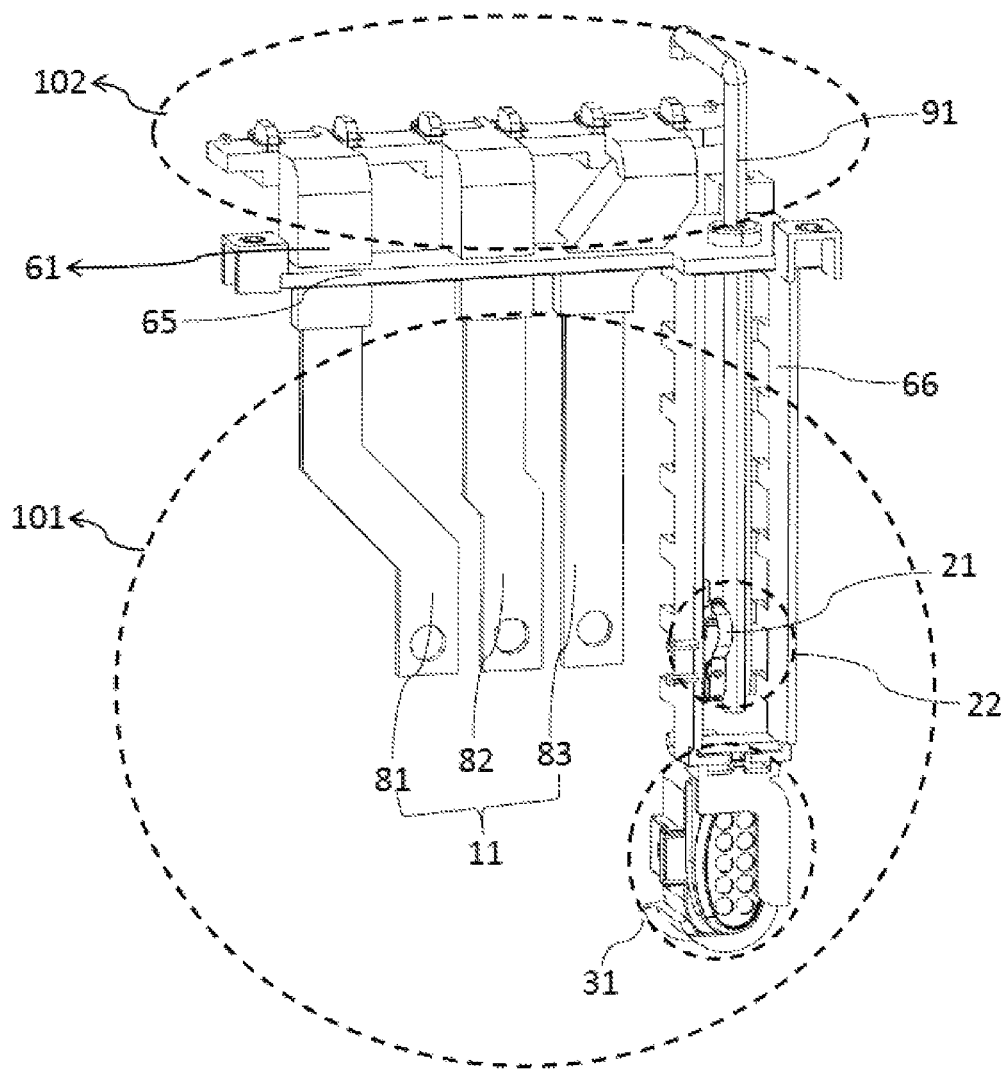
FIG. 1, a schematic perspective view of an example of connection bar according to the invention, FIG. 2, a schematic perspective view of a rest mode of a locking module of the electrical connection bar of the connection bar of FIG. 1, FIG. 3, a schematic perspective view of a use mode of the locking module of the electrical connection bar of FIG. 1.

FIG. 1 represents a schematic perspective view of an electrical connection bar 1 according to the invention. The electrical connection bar 1 is configured to electrically connect a first electrical equipment 2 and a second electrical equipment 3 of the vehicle, which will be shown in greater detail in FIGS. 2 and 3. In a general case, the electrical connection bar 1, the first electrical equipment 2 and the second electrical equipment 3 are housed in an engine compartment of the vehicle. In a preferentially manner, the first electrical equipment 2 is an electric motor 2, and the second electrical equipment 3 is an inverter 3.

The electrical connection bar 1 comprises an electrical connection module 11, a transmission module 31 and may include a locking module 21. The electrical connection module 11 is configured so as to supply the first electrical equipment 2 with an electrical energy controlled by the second electrical equipment 3. In a preferential manner, the first electrical equipment 2 is housed in a box 45 in the engine compartment of the vehicle, and is configured to carry out a conversion of electrical energy into mechanical energy. The second electrical equipment 3, as mentioned above, is configured to generate alternating current in order to supply the first electrical equipment 2. According to an embodiment, the second electrical equipment 3 is installed in a box distinct from the box 45 in which the first electrical equipment 2 is installed. However, the boxes of the first electrical equipment 2 and the second 3 electrical equipment may be assembled together such that the respective outer walls come up against each other. In particular, the electrical connection bar 1 passes through these walls to connect the first electrical equipment 2 and the second 3 electrical equipment.

In a preferential embodiment, the second electrical equipment 3 is a three-phase inverter configured to generate three currents respectively sinusoidal to each other. The invention is not however limited to the type of the second electrical equipment 3. The first electrical equipment 2 comprises at least one conductor 81, 82, and 83. Notably, the electrical connection module 11 comprises a plurality of conductors 81, 82, and 83 fixed to the first electrical equipment 2 and respectively configured to supply the first electrical equipment 2 with a current generated by the second electrical equipment 3. This is in particular the case in an example where the second electrical equipment 3 is a three-phase inverter. In a preferential manner, the conductors 81, 82, and 83 are made of electrically conductive material, for example metal. The fastening of the conductors 81, 82, and 83 to the first electrical equipment 2 is notably achieved by screws. The invention is not however limited either to the number of conductors or to the method of fastening the conductors of the electrical connection module 11 to the first electrical equipment 2.

In a preferential embodiment, the electrical connection bar 1 is mounted at least in part in the second electrical equipment 3. In an advantageous manner, the electrical connection bar 1 is installed at least in part in the box 45 in which the first electrical equipment 2 is housed.

The transmission module 31, integrated with the electrical connection module 11 in the electrical connection bar 1, connects to a corresponding connector of the first electrical equipment 2 delivering an electrical signal representative of a physical property of the first electrical equipment 2. Said physical property of the first electrical equipment 2 comprises the temperature and/or the speed and/or the position of a rotor of the first electrical equipment 2 detected by a sensor of the first electrical equipment 2, such as a temperature or a position sensor. According to a preferential embodiment, the position sensor is a standard sensor. In an advantageous manner, the position sensor is a resolver.

According to an advantageous embodiment, the transmission module 31 comprises at least one electrical conductor configured to transmit into the second electrical equipment 3 said electrical signal representative of the physical property of the first electrical equipment 2. To this end, the transmission module 31 comprises a connector 310 capable of engaging in a corresponding connector of the first electrical equipment 2, notably in a translationally moveable manner. Thus, the transmission module 31 is preferably fastened onto the electrical connection bar 1 so as to be translationally moveable, notably at the level of the connector 310 of the transmission module 31.

According to an advantageous embodiment, the electrical connection bar 1 comprises a body 61 preferably made of electrically insulating material. The body 61 maintains together said electrical conductors of the electrical connection module 11 and the transmission module 31.

As illustrated in FIG. 1, the body 61 comprises a first portion 65, designated interface portion 65, configured to cooperate with an interface 23 between the first electrical equipment 2 and the second electrical equipment 3. In an advantageous manner, the interface portion 65 of the body 61 comprises at least one seal configured to cooperate with said interface 23 so as to guarantee a sealing between the first electrical equipment 2 and the second electrical equipment 3.

The electrical connection bar 1 comprises a first part 101 extending from a first side of the interface portion 65 of the body 61, so as to be housed at least in part in the first electrical equipment 2. The electrical connection bar 1 further comprises a second part 102 extending from a second side of the interface portion 65 of the body 61, so as to be housed at least in part in the second electrical equipment 3.

According to an embodiment, the system comprising the first electrical equipment 2 and the second electrical equipment 3 further comprises a third equipment 4, notably a mechanical equipment such as a gearbox. In a general case, the gearbox 4 is installed in the box 45 of the first electrical equipment 2. In this case, all the components inside the box 45, in particular said first part of the electrical connection bar 1, are in a medium where oil is present. The electrical connection bar 1 is then particularly advantageous because it integrates several modules in a single element, and thereby makes it possible to manage the sealing in one go, notably at the level of the interface portion 65 of the body 61 of the electrical connection bar 1. The electrical connection bar 1 thereby has a resistance to engine fluids and/or those of the gearbox 4. It is noted that in another case with a different configuration, the gearbox 4 is installed outside of the box 45 of the first electrical equipment 2.

The body 61 comprises a second portion 66 extending transversally from the interface portion 65 and comprised in the second part of the electrical connection bar 1. The second portion 66 forms a support for the at least one electrical conductor of the transmission module 31. The second portion 66 further forms a support for the connector 310 of the transmission module 31. In particular, the connector 310 is mounted at a distal end of the second portion 66 of the body 61 with respect to the interface portion 65.

The locking module 21 is notably configured to discharge the second electrical equipment 3. The discharge of the electrical energy present in the second electrical equipment 3 is actuated by the locking module 21. In a preferential manner, the locking module 21, coupled to a closing/opening element 41 of the first electrical equipment 2 (illustrated hereafter), is integrated with the electrical connection module 11 in the electrical connection bar 1. The locking module 21 is configured to deactivate the second electrical equipment 3 when the closing/opening element 41 is actuated in such a way as to open the first electrical equipment 2.

As illustrated in FIG. 1, the locking module 21 comprises at least one electrical conductor configured to be connected to an electrical circuit of the second electrical equipment 3. In a preferential manner, a cable 91 containing the electrical conductors (being in the form of electric wires) of the locking module 21 and the transmission module 31 is maintained on the body 61, notably on the second portion 66 of the body 61. To this end, the second portion 66 may include notches. The body 61 of the electrical connection bar 1 thus maintains together said at least one electrical conductor of the locking module 21 with the electrical conductors of the electrical connection module 11 and the transmission module 31.

The second portion 66 of the body 61 forms a support for a detector 22 of the locking module 21. The detector 22 is configured to detect when the closing/opening element 41 is actuated in such a way as to open the first electrical equipment 32.

A non-limiting example of the invention illustrating a triggering of the discharge of electrical energy from the second electrical equipment 3 will be described in detail in the following paragraphs and in FIGS. 2 and 3.

Figure 2:
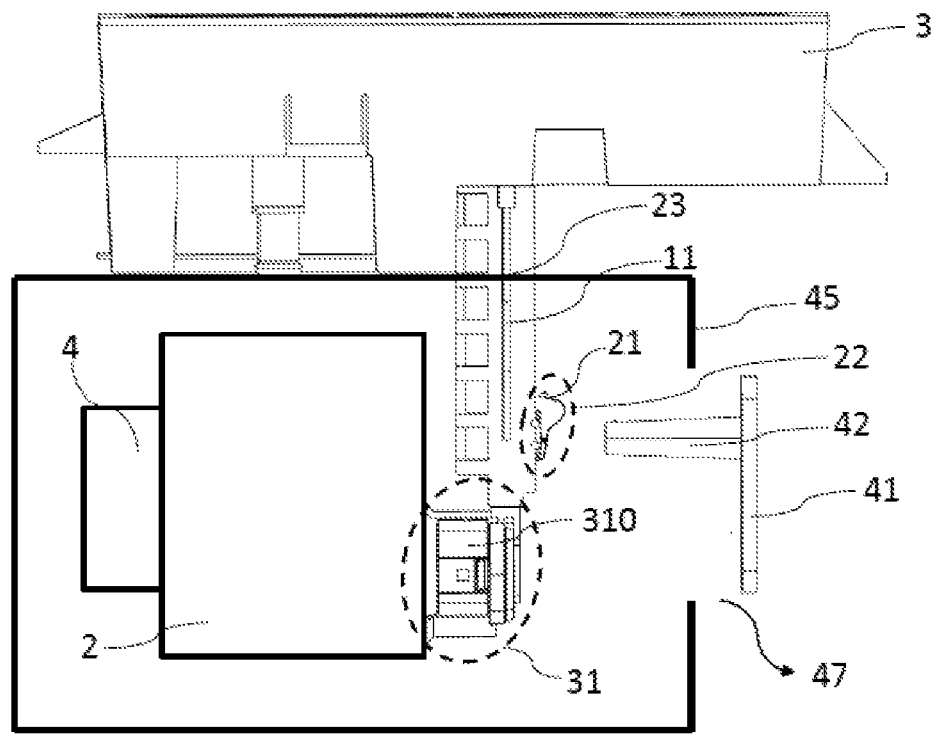

FIG. 2 represents a schematic perspective view of a rest mode of the locking module 21 of the electrical connection bar 1. As described in FIG. 2, the box 45 comprises the closing/opening element 41 which corresponds with an opening 47 formed on the box 45. The closing/opening element 41 forms an actuator configured to actuate, in cooperation with the detector 22, the locking module 21 when the closing/opening element 41 closes or opens the box 45 of the first electrical equipment 2. In addition, the closing/opening element 41 may also be configured to press on the connector 310 of the transmission module 31 so as to displace it towards a corresponding connector of the first electrical equipment 2.

In an advantageous manner, the closing/opening element 41 comprises a removable cover 41 and an excrescence 42. In particular, the detector 22 comprises a button which the excrescence 42 comes up against. The excrescence 42 is formed on an inner surface of the cover 41 and is configured to release the detector 22, notably the bouton, when the cover 41 is open so as to deactivate the second electrical equipment 3. According to an embodiment, the excrescence 42 is a rod 42 extending from an inner surface of the cover 41 and preferentially perpendicular to said inner surface.

Figure 3:
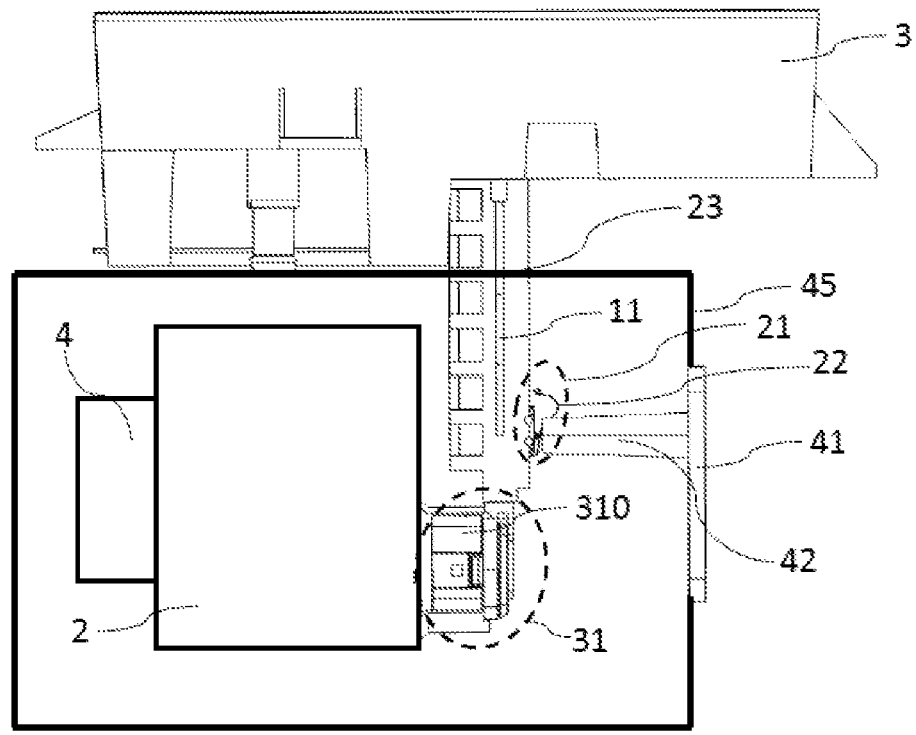

FIG. 3 represents a schematic perspective view of a use mode of the locking module 21 of the electrical connection bar 1. When the closing/opening element 41 closes the box 45, the rod 42 comes closer, through the opening 47, to the detector 22 of the locking module 21. The excrescence 42 is thus configured to press on the detector 22, notably the button of the detector 22, when the closing/opening element 41 is closed so as to enable an operation of the second electrical equipment 3.

According to a preferential embodiment, the detector 22 is a switch 22 configured to open an electrical circuit of the second electrical equipment 3 when said closing/opening element 41 is actuated. According to an alternative embodiment, the detector 22 could be a sensor sending an electrical front to the second electrical equipment 3 during an opening of the box 45 in which the first electrical equipment 2 is installed. The detector 22 is, as mentioned previously and illustrated in FIG. 2, configured to deactivate the second electrical equipment 3 when the detector 22 is released.

As described above, the locking module 21 is installed in the same electrical connection bar 1 as the electrical connection module 11, which makes it possible to improve the integration of an electrical system comprising the first electrical equipment 2 and the second electrical equipment 3. The locking module 21 notably makes it possible to guarantee a discharge of capacitors of the second electrical equipment 3 when the box 45 comprising the first electrical equipment 2 is opened by an operator. Thus, the operator can access the components, such as the electrical conductors of the electrical connection bar 1, in a safe manner without risking electrocution. A vehicle diagnostic may thus be carried out safely by the technician or the driver.

Thanks to the integration of at least two of the three modules comprising the electrical connection module, the locking module and the transmission module all in the same electrical connection bar, the invention makes it possible to improve the modularisation and the sealing of the items of equipment installed in the engine compartment and to reduce the space needed to house these items of equipment in the engine compartment of the vehicle.

What is claimed is:

1. An electrical connection bar configured to electrically connect a first electrical equipment and a second electrical equipment, notably in a vehicle, the electrical connection bar comprising an electrical connection module configured so as to supply the first electrical equipment with an electrical energy controlled by the second electrical equipment; wherein the electrical connection bar comprises:
    a transmission module configured to transmit into the second electrical equipment an electrical signal representative of a physical property of the first electrical equipment, the transmission module being integrated with the electrical connection module;
    a locking module configured to be coupled to a closing/opening element of the first electrical equipment and configured to deactivate the second electrical equipment when the closing/opening element is actuated in such a way as to open the first electrical equipment, said locking module being integrated with the electrical connection module;
    a body configured to maintain together the locking module with the electrical connection module and the transmission module so that the electrical connection bar integrates the three modules to form a single element.

2. The electrical connection bar according to claim 1, in which each of the electrical connection module, the transmission module and the locking module comprises at least one electrical conductor; the body being configured to maintain together the at least one electrical conductor of the locking module with the electrical conductors of the electrical connection module and of the transmission module.

3. The electrical connection bar according to claim 2, in which:
    the body is made of electrically insulating material,
    at least one electrical conductor of the electrical connection module is configured to supply the first electrical equipment with a current generated by the second electrical equipment,
    the at least one electrical conductor of the transmission module is configured to transmit into the second electrical equipment said electrical signal representative of a physical property of the first electrical equipment.

4. The electrical connection bar according to claim 2, in which the at least one electrical conductor of the locking module is configured to be connected to an electrical circuit of the second electrical equipment.

5. The electrical connection bar according to claim 1, in which the transmission module comprises a connector configured to engage with a corresponding connector of the first electrical equipment.

6. The electrical connection bar according to claim 5, in which the connector of the transmission module is fixed on the electrical connection bar so as to be translationally moveable.

7. The electrical connection bar according to claim 1, in which the body comprises a first portion, designated interface portion, configured to cooperate with an interface between the first electrical equipment and the second electrical equipment, and in which:
    a first part of the electrical connection bar extends from a first side of the interface portion of the body, so as to be housed at least in part in the first equipment; and
    a second part of the electrical connection bar extends from a second side of the interface portion of the body, so as to be housed at least in part in the second electrical equipment.

8. The electrical connection bar according to claim 7, in which the body comprises a second portion extending transversally from the interface portion and comprised in the second part of the electrical connection bar, said second portion forming a support for the connector of the transmission module.

9. The electrical connection bar according to claim 8, in which the second portion of the body forms a support for a detector of the locking module, said detector being configured to detect when said closing/opening element is actuated to open the first electrical equipment.

10. An electrical system, notably configured to be on board a vehicle, comprising a first electrical equipment, a second electrical equipment and the electrical connection bar according to claim 1, said electrical connection bar being mounted at an interface between the first electrical equipment and the second electrical equipment.

11. The electrical system according to claim 10, in which the first electrical equipment and the second electrical equipment are respectively installed in a corresponding box, the box in which the first electrical equipment is installed comprising a closing/opening element configured for the closing/opening of said box.

12. The electrical system according to claim 11, in which the closing/opening element forms an actuator configured to actuate a module for locking the electrical connection bar when the closing/opening element closes or opens the box of the first electrical equipment.

13. The electrical system according to claim 12, comprising the electrical connection bar according to claim 1, in which the closing/opening element forms a cover of the box and comprises an excrescence, notably a rod, said excrescence being formed at an inner surface of the cover and configured to:
    press on a detector of the locking module when the cover is closed so as to enable an operation of the second electrical equipment; and
    release said detector when the cover is open so as to deactivate the second electrical equipment.

14. The electrical system according to claim 10, in which the first electrical equipment forms an electric motor and the second electrical equipment forms an inverter controlling said electric motor.

15. The electrical system according to claim 11, comprising an electrical connection bar according to claim 4, in which said closing/opening element forms an actuator configured, when the closing/opening element closes the box of the first electrical equipment, to press on the connector of the transmission module of the electrical connection bar so as to displace it towards a corresponding connector of the first electrical equipment.

16. The electrical connection bar according to claim 1, in which the body comprises a second portion extending transversally from an interface portion and comprised in a second part of the electrical connection bar, said second portion forming a support for the connector of the transmission module.

17. The electrical connection bar according to claim 16, in which the second portion of the body forms a support for a detector of the locking module, said detector being configured to detect when said closing/opening element is actuated to open the first electrical equipment.

\* \* \* \* \*